(12) United States Patent
Liu et al.

(10) Patent No.: US 10,833,107 B2
(45) Date of Patent: Nov. 10, 2020

(54) THIN FILM TRANSISTOR, MANUFACTURING METHOD THEREFOR, ARRAY SUBSTRATE AND DISPLAY DEVICE

(71) Applicant: BOE TECHNOLOGY GROUP CO., LTD., Beijing (CN)

(72) Inventors: Fengjuan Liu, Beijing (CN); Youngsuk Song, Beijing (CN); Hongda Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/322,266

(22) PCT Filed: May 4, 2018

(86) PCT No.: PCT/CN2018/085585
§ 371 (c)(1),
(2) Date: Jan. 31, 2019

(87) PCT Pub. No.: WO2018/205886
PCT Pub. Date: Nov. 15, 2018

(65) Prior Publication Data
US 2019/0165006 A1 May 30, 2019

(30) Foreign Application Priority Data
May 12, 2017 (CN) .......................... 2017 1 0335730

(51) Int. Cl.
H01L 27/12 (2006.01)
H01L 29/786 (2006.01)
(Continued)

(52) U.S. Cl.
CPC ........ H01L 27/1288 (2013.01); H01L 27/127 (2013.01); H01L 29/41733 (2013.01);
(Continued)

(58) Field of Classification Search
CPC .......... H01L 27/1288; H01L 29/78696; H01L 29/66969; H01L 29/66757; H01L 29/7869;
(Continued)

(56) References Cited

U.S. PATENT DOCUMENTS

2008/0213961 A1* 9/2008 Leonardi .......... H01L 29/66757
438/285
2010/0295049 A1 11/2010 Yoo et al.
(Continued)

FOREIGN PATENT DOCUMENTS

| CN | 101840865 A | 9/2010 |
|---|---|---|
| CN | 101894807 A | 11/2010 |

(Continued)

OTHER PUBLICATIONS

International Search Report and Written Opinion dated Aug. 8, 2018.

Primary Examiner — Yasser A Abdelaziez
(74) Attorney, Agent, or Firm — Dilworth & Barrese, LLP.; Michael J. Musella, Esq.

(57) ABSTRACT

Provided are a thin film transistor and manufacturing method therefor, and an array substrate, and a display device. The method includes: forming a source electrode and a drain electrode on a substrate; forming a photoresist layer at the side of the source electrode and the drain electrode away from the substrate; performing exposure and developing treatment on the photoresist layer so as to obtain a photoresist pattern; successively forming a semiconductor layer, a first insulation layer and a conducting layer in sequence on at the side of the photoresist pattern away from the substrate; and removing the photoresist pattern so as to obtain an active layer a gate insulation layer and a gate electrode.

10 Claims, 3 Drawing Sheets

(51) Int. Cl.
*H01L 29/66* (2006.01)
*H01L 29/417* (2006.01)

(52) U.S. Cl.
CPC .. *H01L 29/66742* (2013.01); *H01L 29/66757* (2013.01); *H01L 29/66969* (2013.01); *H01L 29/786* (2013.01); *H01L 29/7869* (2013.01); *H01L 29/78696* (2013.01)

(58) Field of Classification Search
CPC ......... H01L 29/41733; H01L 29/66742; H01L 29/786; H01L 27/127; H01L 27/1225
See application file for complete search history.

(56) References Cited

U.S. PATENT DOCUMENTS

| | | | |
|---|---|---|---|
| 2014/0103338 A1* | 4/2014 | Yamazaki | H01L 21/02631 257/43 |
| 2015/0200281 A1* | 7/2015 | Yang | H01L 29/78606 257/43 |
| 2016/0020299 A1* | 1/2016 | Gregory | H01L 29/66757 438/299 |
| 2018/0212062 A1 | 7/2018 | Xie | |
| 2019/0165006 A1 | 5/2019 | Liu et al. | |

FOREIGN PATENT DOCUMENTS

| | | |
|---|---|---|
| CN | 103094205 A | 5/2013 |
| CN | 103346093 A | 10/2013 |
| CN | 104218074 A | 12/2014 |
| CN | 106098784 A | 11/2016 |
| CN | 106935660 A | 7/2017 |
| KR | 1020080111231 A | 12/2008 |

* cited by examiner

THIN FILM TRANSISTOR, MANUFACTURING METHOD THEREFOR, ARRAY SUBSTRATE AND DISPLAY DEVICE

CROSS-REFERENCE OF RELATED APPLICATION

The present application claims the priority of Chinese patent application No. 201710335730.0 filed on May 12, 2017, the disclosure of which is hereby incorporated by reference herein in its entirety.

TECHNICAL FIELD

Embodiments of the present disclosure relate to a thin film transistor, a method for manufacturing the same, an array substrate and a display device.

BACKGROUND

Currently, stacked bottom-gate structures are adopted by most oxide thin film transistors, and mainly classified into an etch-stop-layer (ESL) type and a back-channel-etched (BCE) type, which can obtain relatively stable switching characteristics. However, a source electrode and a drain electrode of the self-aligned top-gate transistors are typically conductive through the conductive treatment of the oxide semiconductor, the resistance is still large, the conductive effect is not satisfactory, and the conductive stability is relatively poor.

SUMMARY

Embodiments of the present disclosure provide a thin film transistor, a method for manufacturing the same, an array substrate and a display device.

In first aspect of the present disclosure, it is provided A method for manufacturing a thin film transistor, comprising: forming a source electrode and a drain electrode on a base substrate; forming a photoresist layer on a side of the source electrode and the drain electrode away from the base substrate; exposing and developing the photoresist layer to form a photoresist pattern; forming a semiconductor layer, a first insulation layer and a conductive layer successively on a side of the photoresist pattern away from the base substrate; and removing the photoresist pattern to form an active layer, a gate insulation layer and a gate electrode.

In second aspect of the present disclosure, it is provided a thin film transistor, comprising: a base substrate; a gate electrode, a source electrode, a drain electrode, and an active layer disposed on the base substrate, wherein the source electrode and the drain electrode each contains a metal, the active layer is disposed between the source electrode and the drain electrode, and is respectively in contact with side surfaces of the source electrode and the drain electrode.

In third aspect of the present disclosure, it is provided an array substrate comprising the above-mentioned thin film transistor.

In fourth aspect of the present disclosure, it is provided a display device comprising the above-mentioned array substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the present disclosure provides a method for manufacturing a thin film transistor, the method comprises: forming a source electrode and a drain electrode on a base substrate; forming a photoresist layer on a side of the source electrode and the drain electrode away from the base substrate; exposing and developing the photoresist layer to form a photoresist pattern; and forming a semiconductor layer, a first insulation layer, and a conductive layer successively on a side of the photoresist pattern away from the base substrate; and removing the photoresist pattern to form an active layer, a gate insulation layer, and a gate electrode.

In the above manufacturing method, the photoresist layer is exposed on its front side or rear side, a mask can be saved, the process is simplified, and the cost is reduced; the metal is directly used as the source-drain conductive region of the thin film transistor, without additional conductive treatment, thus the problem that the conductive stability of the source electrode and the drain electrode is poor is solved; the gate electrode does not overlap the source electrode or drain electrode, so there is no display quality problem caused by parasitic capacitance.

Figure 1:
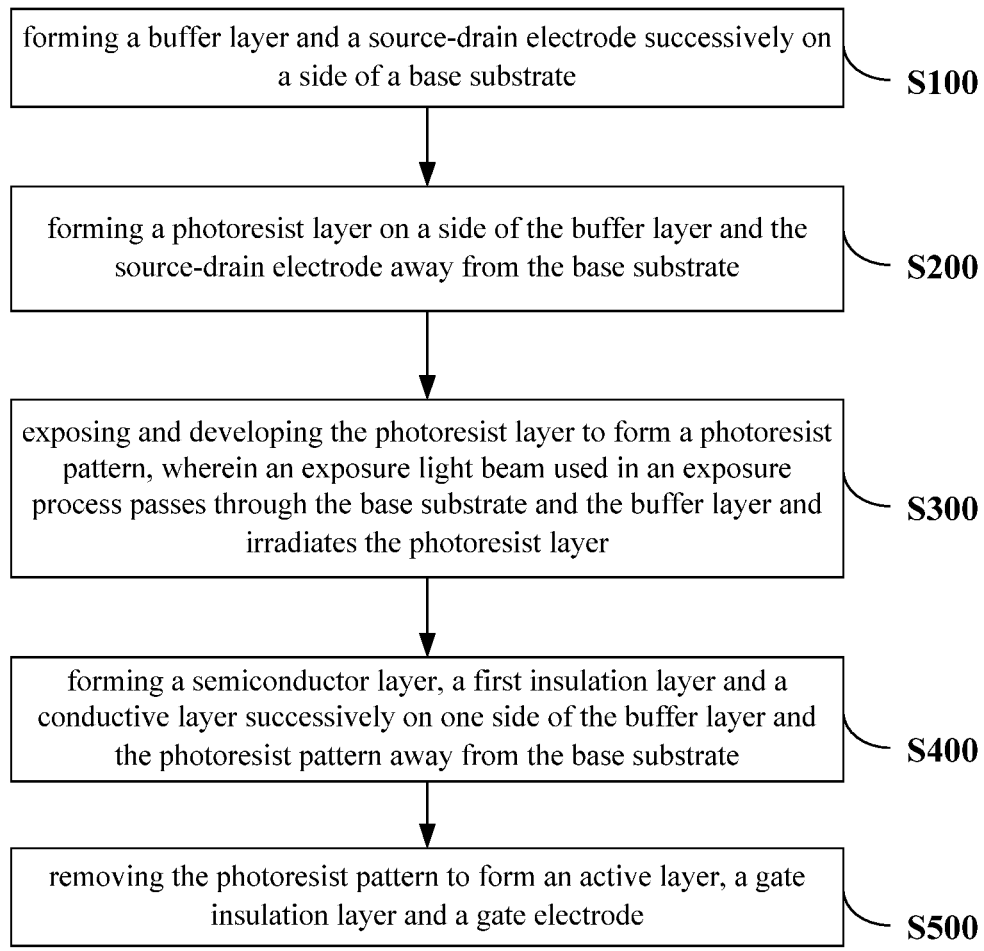
FIG. 1 schematically illustrates a flow chart of a method for manufacturing a thin film transistor according to an embodiment of the present disclosure.

As illustrated in FIGS. 1 to 8, a method for manufacturing the thin film transistor provided in the present disclosure will be described in detail. In at least some embodiments, as illustrated in FIG. 1, the method comprises:

S100: forming a buffer layer and source and drain electrodes successively on a side of a base substrate.

Figure 2:
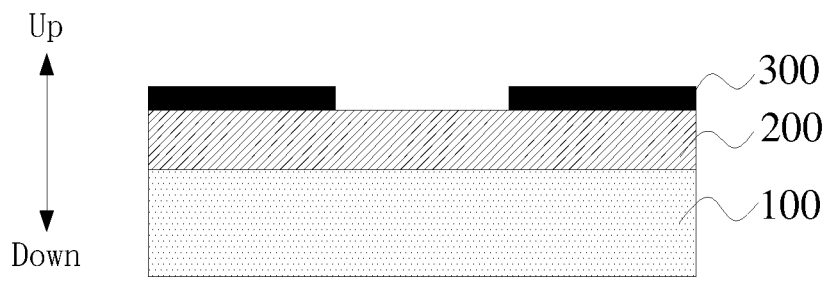
FIG. 2 schematically illustrates a thin film transistor obtained from step S100 of a manufacturing method according to an embodiment of the present disclosure.

For example, as illustrated in FIG. 2, the buffer layer 200 and the source and drain electrodes 300 may be formed successively from bottom to top on one side of the base substrate 100.

In at least some embodiments, a source-drain metal layer may be formed on the entire surface of the base substrate 100, the source and drain electrodes 300 may be formed by patterning the source-drain metal layer.

In at least some embodiments, the base substrate 100 is made from a light-transmitting material, that is, the light-transmitting material is capable of transmitting an exposure light beam in an exposure process. Thus, when the photoresist layer is exposed on a rear side, ultraviolet (UV) light can penetrate the base substrate 100, and the photoresist layer is photo-etched effectively. In some embodiments of the present disclosure, the material of the base substrate 100 may comprises at least one selected from the group consisting of glass, quartz and a flexible material. Thus, when the photoresist layer is exposed on the rear side, ultraviolet (UV) light can easily penetrate base substrate 100. For example, the base substrate 100 is made from the material being capable of transmitting ultraviolet light.

In at least some embodiments, the buffer layer 200 is made from a light-transmitting material, that is, the light-transmitting material is capable of transmitting an exposure light beam in an exposure process. Thus, when the photoresist layer is exposed on a rear side, ultraviolet (UV) light can penetrate the buffer layer 200, and the photoresist layer is photo-etched effectively. In some embodiments of the present disclosure, the material of the buffer layer may comprise at least one selected from a group consisting of $SiO_2$, $SiN_x$ and $SiON_x$. Thus, when the photoresist layer is exposed on the rear side, ultraviolet (UV) light can effectively penetrate the buffer layer 200. For example, the buffer layer 200 is made of a material being capable of transmitting ultraviolet light. In order to avoid the influence of the base substrate 100 on the active layer 510, for example, the buffer layer 200 is formed between the base substrate 100 and the active layer 510. It is understood that, in other embodiments, the buffer layer 200 may not be formed, and the object of the present disclosure can also be achieved.

In at least some embodiments, the specific method for forming the buffer layer 200 on one side of the base substrate 100 is not limited in the present disclosure, any method for forming a buffer layer commonly used in the art, such as a deposition method, an evaporation method, or the like, may be adopted as long as a light-transmitting buffer layer 200 can be formed on one side of a light-transmitting base substrate 100 by the method. Those skilled in the art may select appropriate method according to actual requirements of manufacturing process, details are not described herein again.

In at least some embodiments, the specific material of the source and drain electrodes 300 is not limited in the present disclosure, as long as the source and drain electrodes 300 made of the material has a conductive property and can block the ultraviolet light. Those skilled in the art may select appropriate material according to actual requirements of manufacturing process. For example, the material of the source and drain electrodes 300 includes, but not limited to metals, non-ferrous alloys, etc. Thus, the source and drain electrodes 300, which are made of the above material, have good electrical conductivity and are less transparent to ultraviolet light.

In at least some embodiments, the specific method for forming the source and drain electrodes 300 on one side of the buffer layer 200 away from the base substrate 100 is not limited in the present disclosure, any method for forming the source electrode and the drain electrode commonly used in the art may be used, as long as the opaque source electrode 300 and opaque drain electrode 300 can be formed on one side of the light-transmitting buffer layer 200 by the method (here, "opaque" refers to that the exposure light beam cannot penetrate the source electrode and the drain electrode, that is, the source electrode and drain electrode each is made of the material that blocks the exposure light beam). Those skilled in the art may select appropriate material according to actual requirements of manufacturing process. In some embodiments of the present disclosure, the source and drain electrodes 300 may be formed by a deposition method. Thus, the source and drain electrodes 300 formed by the above method not only has an electrical conductivity, but also can prevent ultraviolet light from penetrating, and the method is simple in operation and low in cost.

S200: forming a photoresist layer on a side of the buffer layer and the source and drain electrodes away from the base substrate.

Figure 3:
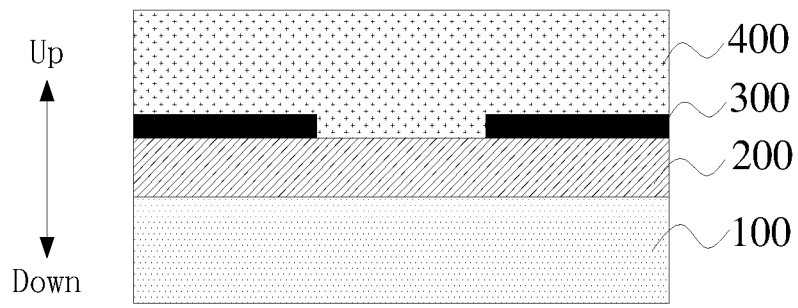
FIG. 3 schematically illustrates a thin film transistor obtained from step S200 of a manufacturing method according to an embodiment of the present disclosure.

For example, as illustrated in FIG. 3, the photoresist layer 400 may be further coated on one side of the buffer layer 200 and the source and drain electrodes 300 away from the base substrate 100.

In at least some embodiments, the photoresist layer 400 may be made of a positive photoresist material. Thus, after the photoresist layer 400 is exposed under the light from its rear side and developed by using the source and drain electrodes 300 as a mask, the photoresist having the same pattern as the source and drain electrodes 300 can be formed on one side of the source and drain electrodes 300 away from the base substrate 100, thus it facilitates to form other structures in the regions having no photoresist coated thereon.

In at least some embodiments, the specific method for forming the photoresist layer 400 is not limited in present disclosure, any method for forming the photoresist layer commonly used in the art may be used, as long as the photoresist layer 400 can be formed on one side of the buffer layer 200 and the source and drain electrodes 300 away from the base substrate 100 by the method. Those skilled in the art may select appropriate method and adjust according to actual requirements of manufacturing process, and details are not described herein.

S300: exposing and developing the photoresist layer to form a photoresist pattern, wherein an exposure light beam used in an exposure process passes through the base substrate and the buffer layer and irradiates the photoresist layer.

Figure 4:
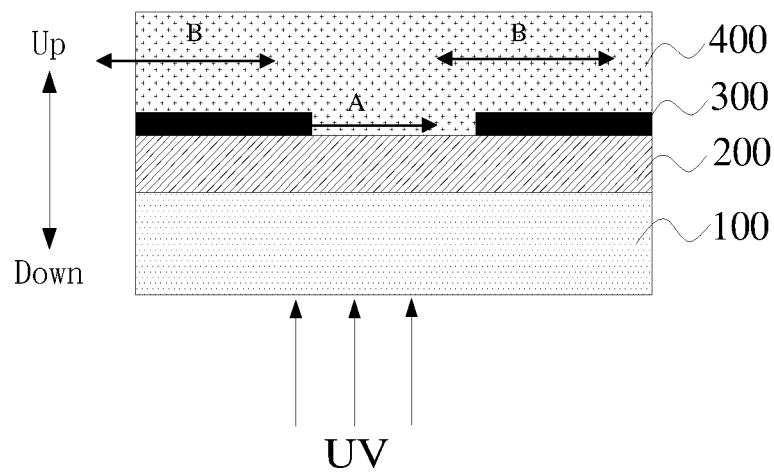
FIG. 4 schematically illustrates a back-side exposure of a manufacturing method according to an embodiment of the present disclosure.

For example, as illustrated in FIG. 4, the photoresist layer 400 may be exposed to UV light by a back-side exposure in which the UV light comes from the side of the base substrate 100 away from the photoresist layer 400, i.e., the UV light propagating along a direction from bottom to top irradiate the photoresist layer 400. Then, the photoresist layer 400 is developed to form the photoresist pattern 410 having the same pattern as that of the source and drain electrodes 300, the specific structure is referred to FIG. 5. Because the photoresist layer is exposed by using the source and drain electrodes 300 as a mask, an additional mask can be saved, the process can be simplified, and the cost can be reduced. It can be understood that, in other embodiments, the photoresist layer 400 may be exposed to UV light by a front-side exposure in which the UV light comes from a front side of the photoresist layer, i.e., the UV light propagating along a direction from top to bottom irradiates the photoresist layer 400; then, the photoresist pattern 410 is developed to have the same pattern as that of the source and drain electrodes 300.

Figure 5:
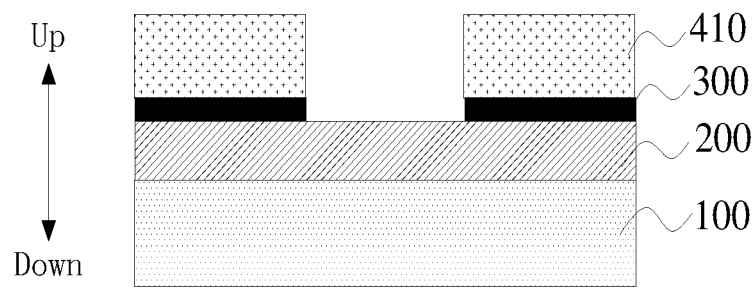
FIG. 5 schematically illustrates a thin film transistor obtained from step S300 of a manufacturing method according to an embodiment of the present disclosure.

As illustrated in FIG. 5, the photoresist layer 400 comprises a first region A that is irradiated with UV light and a second region B that is not irradiated with UV light. After the photoresist layer 400 is developed, the photoresist layer in the first region A is removed, the photoresist layer in the second region B is retained, and finally the photoresist pattern showed in FIG. 5 is formed.

In at least some embodiments, the specific method and parameters in the processes of exposure and development are not limited in the present disclosure, as long as the photoresist having the same pattern can be formed on an upper surface of the source and drain electrodes after the processes, those skilled in the art may select and adjust according to actual requirements of manufacturing process, and details are not described herein.

S400: forming a semiconductor layer, a first insulation layer and a conductive layer successively on one side of the buffer layer and the photoresist pattern away from the base substrate.

Figure 6:
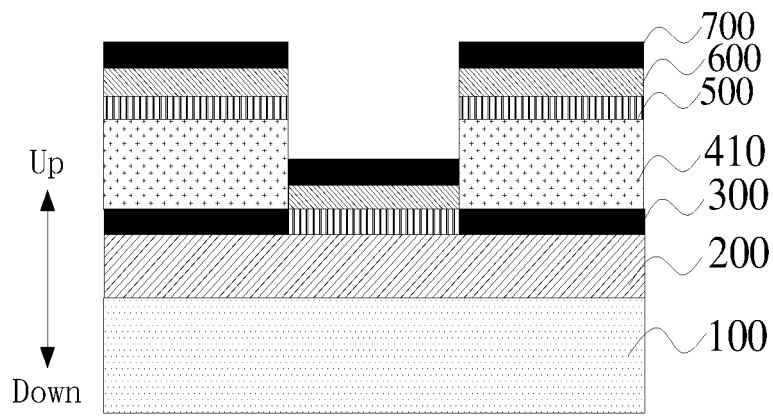
FIG. 6 schematically illustrates a thin film transistor obtained from step S400 of a manufacturing method according to an embodiment of the present disclosure.

For example, as illustrated in FIG. 6, the semiconductor layer 500, the first insulation layer 600 and the conductive layer 700 are coated successively on upper surfaces of both the photoresist pattern 410 and the buffer layer 200.

In at least some embodiments, the specific method for forming the semiconductor layer 500, the first insulation layer 600 and the conductive layer 700 is not limited in the present disclosure, any method for forming the semiconductor layer, the first insulation layer and the conductive layer is commonly used in the art may be used, as long as the above three-layer structure can be formed successively on upper surfaces of the photoresist pattern and the buffer layer, those skilled in the art may select according to actual requirements of manufacturing process. In some embodiments of the present disclosure, an active layer, an insulation layer and a gate may be formed by a deposition method. Thus, the above deposition method is simple in operation and low in cost.

S500: removing the photoresist pattern to form an active layer, a gate insulation layer and a gate electrode.

Figure 7:
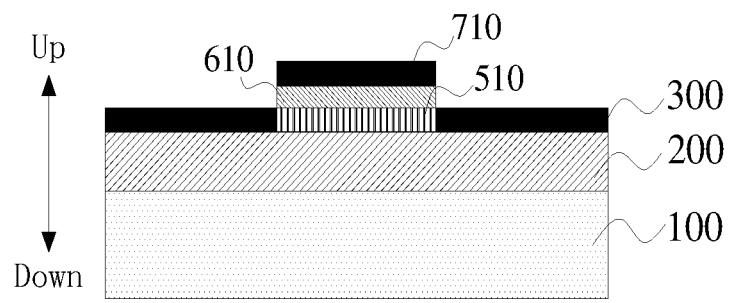
FIG. 7 schematically illustrates a thin film transistor obtained from step S500 of a manufacturing method according to an embodiment of the present disclosure.

For example, the photoresist pattern 410 disposed on the upper surfaces of the source and drain electrodes 300 and the layered structures (comprising a portion of the semiconductor layer 500, the first insulation layer 600 and the conductive layer 700) disposed on the photoresist pattern 410 are removed together, and the specific structure obtained after the removal is referred to FIG. 7. Thus, the active layer 510, the gate insulation layer 610 and the gate electrode 710 may be formed, thereby, a design of a mask for the pattern is not needed, the method is simple in operation and low in cost.

In at least some embodiments, the specific method for removing the photoresist is not limited in the present disclosure, as long as the photoresist pattern 410 and the layered structures on its upper surface can be removed together, those skilled in the art may select according to materials and properties of the photoresist pattern and the layered structures. In some embodiments of the present disclosure, the method for removing the photoresist pattern 410 may be a stripping method. Thus, the photoresist pattern 410 is stripped by the above method, which can avoid the influence of the etchant in a wet etching process on the performance of the array substrate, and the surface performance of the source and drain electrodes 300 is also better after stripping.

As illustrated in FIGS. 6 and 7, orthographic projections of the active layer 510, the gate insulation layer 610 and the gate electrode 710 on a plane of the base substrate 100 is completely overlapped with the orthographic projection of the first region A of the photoresist layer 400 on the plane of the base substrate 100.

As illustrated in FIGS. 6 and 7, a step of removing the photoresist pattern 410 to form the active layer, the gate insulation layer and the gate electrode comprises: removing the photoresist layer in the second region B as well as a portion of the semiconductor layer 500, a portion of the first insulation layer 600 and a portion of the conductive layer 700 in the second region B.

As illustrated in FIG. 6, before removing the photoresist pattern 410 to form the active layer, the gate insulation layer and the gate electrode, the semiconductor layer 500 covers and contacts the photoresist layer 400 in the second region B.

As illustrated in FIG. 6, after removing the photoresist pattern 410 to form the active layer, the gate insulation layer and the gate electrode, the active layer 510 covers and contacts the buffer layer 200 in the first region A.

In at least some embodiments, the method may further comprises:

S600: depositing a second insulation layer on one side of the source and drain electrodes and the gate electrode away from the base substrate.

Figure 8:
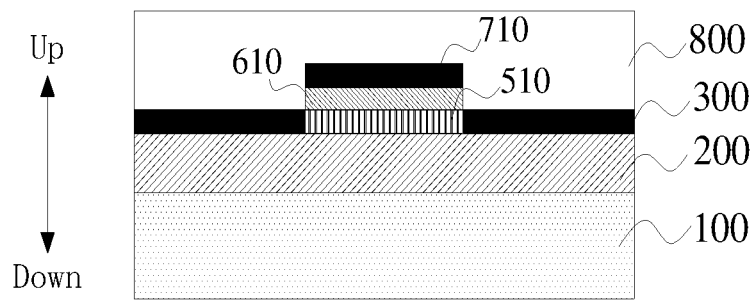
FIG. 8 schematically illustrates a thin film transistor obtained from step S600 of a manufacturing method according to an embodiment of the present disclosure.

In this step, as illustrated in FIG. 8, the second insulation layer 800 may be further formed on upper surfaces of the source and drain electrodes 300 and the gate electrode 710 after the photoresist pattern 410 is stripped. Thus, the second insulation layer 800 can protect the source and drain electrodes 300 and the gate electrode 710 with top-gate structure from being exposed to the outside and being easily damaged. The second insulation layer 800 may also be used for planarization.

In at least some embodiments, the specific method for forming the second insulation layer 800 is not limited in the present disclosure, any method for forming an insulation layer commonly used in the art may be used, as long as the second insulation layer 800 formed by the method can effectively protect the source and drain electrodes 300 and the gate electrode 710 without affecting their performance, and those skilled in the art may select according to actual situation in manufacturing process. In some embodiments of the present disclosure, the second insulation layer 800 may be deposited on one side of the source and drain electrodes 300 and the gate electrode 710 away from the base substrate 100. Thus, the second insulation layer 800 formed by the above deposition method has a better adhesion to the upper surfaces of the source and drain electrodes 300 and the gate electrode 710, and has a better integration, it can function not only as an interlayer dielectric layer, but also as a passivation layer to protect the source and drain electrodes 300 and the gate electrode 710.

In summary, in at least some embodiments, the present disclosure provides a method for manufacturing a thin film transistor; the photoresist layer is exposed on a front side or a rear side, a mask can be saved, the process is simplified, and the cost is reduced; the metal is directly used as the source-drain conductive region of the thin film transistor, without additional conductive treatment, thus the problem that the conductive stability of the source electrode and the drain electrode is poor is solved; the gate electrode and any one of the source and drain electrodes are not overlapped with each other, so there is no display quality problem caused by parasitic capacitance.

An embodiment of the present disclosure further provides a thin film transistor, which is formed by the method described in above embodiments. For example, as illustrated in FIG. 8, the thin film transistor comprises: a base substrate 100; a gate electrode 710, a source electrode 300, a drain electrode 300, and an active layer 510, all of which are disposed on the base substrate 100; the source and drain electrodes 300 each contains a metal, the active layer 510 is disposed between the source electrode and the drain electrode, and is respectively in contact with side surfaces of the source electrode and the drain electrode.

In summary, in at least some embodiments, the present disclosure provides a thin film transistor; the gate electrode and any one of the source and drain electrodes are not overlapped with each other, so there is no display quality problem caused by parasitic capacitance; and the metal or alloy is directly used as the source electrode and the drain electrode, an additional conductive treatment is not required, thus the problem of the poor conductive stability of the source electrode and the drain electrode is not caused. Those skilled in the art will understand that, the features and advantages previously described with respect to the method for manufacturing the thin film transistor are still applicable to the thin film transistor, and details are not described herein.

An embodiment of the present disclosure further comprises an array substrate, which comprises the thin film transistor described in above embodiments. It is noted that, the array substrate may further comprise other essential components and structures in addition to the thin film transistor, such as a pixel electrode, a data line, a peripheral circuit region and so on, and those skilled in the art may design and arrange according to the specific use requirements of the array substrate, and details are not described herein.

The array substrate provided in embodiments of the present disclosure has a higher yield rate and a lower cost. Those skilled in the art will understand that, the features and advantages previously described with respect to the thin film transistor and the method for manufacturing the thin film transistor are still applicable to the array substrate, and details are not described herein.

An embodiment of the present disclosure further comprises a display device, which comprises the array substrate described in above embodiments.

In at least some embodiments, the specific type of the display device is not limited in the present disclosure, any type of display device known in the art may be used, such as a television, a mobile phone, a computer monitor, a tablet computer, a game machine, a wearable device, a household appliance with a display panel and so on, and those skilled in the art may select according to the actual use conditions of the display device, and details are not described herein.

It is noted that, in addition to the array substrate, the display device further comprises other essential components and structures, taking a liquid crystal display as an example, such as a color filter substrate, a liquid crystal display layer, a light source component, a control component, a circuit, a housing and so on, those skilled in the art may arrange according to the specific use requirements of the array substrate, and details are not described herein.

The display quality of the display device provided in the present disclosure is more stable, and the cost is reduced, thus the product competitiveness is improved. Those skilled in the art will understand that, the features and advantages previously described with respect to the array substrate, the thin film transistor and the method for manufacturing the thin film transistor are still applicable to the display device, and details are not described herein.

In embodiments of the present disclosure, the source electrode and the drain electrode each is formed on the base substrate on which the buffer layer is disposed, the positive photoresist is coated, the pattern of the source electrode and the drain electrode is used as a mask, and the photoresist may be exposed on a rear side and developed. Then, the semiconductor layer, the insulation layer and the metal conductive layer are deposited, and the active layer, the gate insulation layer and the gate electrode are formed between the source and drain electrodes, after stripping the photoresist and the layers thereon. Using the above method, the process can be simplified, the number of masks and the times of exposure can be reduced, and the source-drain region with better conductivity can be formed, which is advantageous for obtaining a top-gate thin film transistor with better performance and reducing parasitic capacitance greatly.

In the present disclosure, the following should be noted
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness of a layer or area may be enlarged or narrowed, that is, the drawings are not drawn in a real scale.
(3) In case of no conflict, features in one embodiment or in different embodiments can be combined as a new embodiment.

What is described above is related to the illustrative embodiments of the disclosure only and not limitative to the scope of the disclosure; the scopes of the disclosure are defined by the accompanying claims.

The invention claimed is:
1. A method for manufacturing a thin film transistor, comprising:
forming a buffer layer on a base substrate;
forming a source electrode and a drain electrode on a base substrate the buffer layer, the buffer layer is between the base substrate and the source electrode and between the base substrate and the drain electrode;
forming a photoresist layer on a side of the source electrode and the drain electrode away from the base substrate;
exposing and developing the photoresist layer to form a photoresist pattern;

forming a semiconductor layer, a first insulation layer and a conductive layer successively on a side of the photoresist pattern away from the base substrate; and removing the photoresist pattern to form an active layer, a gate insulation layer and a gate electrode, wherein the photoresist layer is exposed to an UV light, the UV light comes from a side of the base substrate away from the photoresist layer and passes through the base substrate and the buffer layer to irradiate the photoresist layer, where the source electrode and the drain electrode serve as a mask for exposing the photoresist layer so as to form the photoresist pattern, such that the photoresist pattern has a same pattern as those of the source electrode and the drain electrode, and the mask is only one mask for forming the photoresist pattern, wherein after removing the photoresist pattern to form the active layer, the gate insulation layer and the gate electrode, the method further comprises:

forming a second insulation layer on one side of the source electrode and the drain electrode away from the base substrate, wherein the second insulation layer overlays the source electrode, the drain electrode and the gate electrode, and the second insulation layer has a planar surface.

2. The method for manufacturing the thin film transistor according to claim 1, wherein the photoresist layer comprises a first region that is irradiated with the exposure light beam and a second region that is not irradiated with the exposure light beam; after the photoresist layer is developed, the photoresist layer in the first region is removed, and the photoresist layer in the second region is retained.

3. The method for manufacturing the thin film transistor according to claim 2, wherein orthographic projections of the active layer, the gate insulation layer and the gate electrode on a plane of the base substrate is completely overlapped with the orthographic projection of the first region of the photoresist layer on the plane of the base substrate.

4. The method for manufacturing the thin film transistor according to claim 2, wherein the removing the photoresist pattern to form the active layer, the gate insulation layer and the gate electrode comprises: removing the photoresist layer in the second region as well as a portion of the semiconductor layer, a portion of the first insulation layer and a portion of the conductive layer in the second region.

5. The method for manufacturing the thin film transistor according to claim 2, wherein before removing the photoresist pattern to form the active layer, the gate insulation layer and the gate electrode, the semiconductor layer covers and contacts the photoresist layer in the second region.

6. The method for manufacturing the thin film transistor according to claim 2, wherein after removing the photoresist pattern to form the active layer, the gate insulation layer and the gate electrode, the active layer covers and contacts the buffer layer in the first region.

7. The method for manufacturing the thin film transistor according to claim 1, wherein a material of the base substrate comprises at least one selected from a group consisting of glass, quartz and flexible material.

8. The method for manufacturing the thin film transistor according to claim 1, wherein a material of the buffer layer comprises at least one selected from a group consisting of SiO2, SiNx and SiONx.

9. The method for manufacturing the thin film transistor according to claim 1, wherein the source electrode and the drain electrode, the semiconductor layer, the first insulation layer and the conductive layer is formed respectively by a deposition method.

10. The method for manufacturing the thin film transistor according to claim 1, wherein a method for removing the photoresist pattern is an off-ground stripping method.

* * * * *